United States Patent
Ong et al.

(10) Patent No.: US 7,273,767 B2
(45) Date of Patent: Sep. 25, 2007

(54) METHOD OF MANUFACTURING A CAVITY PACKAGE

(75) Inventors: King Hoo Ong, Penang (MY); Lily Khor, Kedah (MY); Boon Pek Liew, Perak (MY); Kai Choh Thong, Perak (MY)

(73) Assignee: Carsem (M) Sdn. Bhd. (MY)

( * ) Notice: Subject to any disclaimer, the term of this patent is extended or adjusted under 35 U.S.C. 154(b) by 0 days.

(21) Appl. No.: 11/123,463

(22) Filed: May 4, 2005

(65) Prior Publication Data

US 2006/0148127 A1    Jul. 6, 2006

(30) Foreign Application Priority Data

Dec. 31, 2004  (MY) ............................. PI 2004 5436

(51) Int. Cl.
*H01L 21/00* (2006.01)

(52) U.S. Cl. ........................................ 438/113; 438/127

(58) Field of Classification Search ................ 438/106, 438/112, 113, 114, 116, 123, 124, 127, 111, 438/7, 16, 64, 65; 257/96, 417, 432, 433, 257/434, 435, 666, 673, 678, 687, E23.116, 257/E21.499, E33.066, E23.052
See application file for complete search history.

(56) References Cited

U.S. PATENT DOCUMENTS

| | | | |
|---|---|---|---|
| 3,748,571 A | | 7/1973 | Kurtz |
| 4,971,930 A | * | 11/1990 | Fusaroli et al. ............. 438/116 |
| 5,672,909 A | | 9/1997 | Glenn et al. |
| 5,719,069 A | | 2/1998 | Sparks |
| 5,827,999 A | | 10/1998 | McMillan et al. |
| 5,831,170 A | | 11/1998 | Sokn |
| 5,862,248 A | | 1/1999 | Salatino et al. |
| 5,863,810 A | * | 1/1999 | Kaldenberg ................... 438/27 |
| 5,867,368 A | | 2/1999 | Glenn |
| 5,949,655 A | | 9/1999 | Glenn |

(Continued)

FOREIGN PATENT DOCUMENTS

JP          10-065219          3/1998

(Continued)

OTHER PUBLICATIONS

Center for Environmental Biotechnology Biosensor Primer "Advanced Bioreporter Technologies for Targeted Sensing of Chemical and Biological Agents" Retrieved from the internet <http://www.ceb.utk.edu/bioprimer.pdf> on Mar. 21, 2005.

(Continued)

*Primary Examiner*—Matthew Smith
*Assistant Examiner*—Khiem D Nguyen
(74) *Attorney, Agent, or Firm*—Townsend and Townsend and Crew LLP (57) ABSTRACT

A method of making a package for an integrated circuit die. In one embodiment the method comprises providing a semiconductor wafer having a plurality of integrated circuit die formed thereon, each integrated circuit die having a first surface and a second surface opposite the first surface and a plurality of bonding pads formed on the first surface, prior to dicing the semiconductor wafer, selectively applying a curable material over a portion of the first surface of an integrated circuit die formed on the wafer without covering the plurality of bonding pads, curing the curable material and dicing the semiconductor wafer to separate the integrated circuit die from other integrated circuit die formed upon the wafer.

24 Claims, 8 Drawing Sheets

U.S. PATENT DOCUMENTS

| | | | |
|---|---|---|---|
| 5,950,074 | A | 9/1999 | Glenn et al. |
| 5,963,679 | A | 10/1999 | Setlak |
| 6,075,237 | A | 6/2000 | Ciccarelli |
| 6,117,705 | A | 9/2000 | Glenn et al. |
| 6,268,654 | B1 | 7/2001 | Glenn et al. |
| 6,285,064 | B1 | 9/2001 | Foster |
| 6,300,169 | B1 | 10/2001 | Weiblen et al. |
| 6,352,880 | B1 * | 3/2002 | Takai et al. ............... 438/106 |
| 6,420,201 | B1 | 7/2002 | Webster |
| 6,479,323 | B1 * | 11/2002 | Lo et al. ................. 438/111 |
| 6,492,204 | B1 * | 12/2002 | Jacobs ..................... 438/127 |
| 6,503,780 | B1 * | 1/2003 | Glenn et al. ............. 438/116 |
| 6,528,869 | B1 | 3/2003 | Glenn et al. |
| 6,528,875 | B1 | 3/2003 | Glenn et al. |
| 6,603,183 | B1 | 8/2003 | Hoffman |
| 6,667,439 | B2 | 12/2003 | Salatino et al. |
| 6,740,870 | B1 | 5/2004 | Doudoumopoulos |
| 6,960,491 | B2 * | 11/2005 | Lin et al. ................. 438/108 |
| 2003/0116817 | A1 | 6/2003 | Yeh et al. |
| 2004/0106233 | A1 * | 6/2004 | Lin et al. ................. 438/108 |
| 2004/0150064 | A1 * | 8/2004 | Rissling et al. .......... 257/434 |
| 2004/0195492 | A1 | 10/2004 | Hsin |
| 2005/0009239 | A1 * | 1/2005 | Wolff et al. .............. 438/123 |
| 2005/0275089 | A1 * | 12/2005 | Joshi et al. .............. 257/727 |
| 2006/0001130 | A1 * | 1/2006 | Islam et al. .............. 257/666 |
| 2006/0006405 | A1 * | 1/2006 | Mazzochette ............. 257/99 |
| 2006/0046347 | A1 * | 3/2006 | Wood et al. .............. 438/106 |

OTHER PUBLICATIONS

Obina, Denice "Fujistu, Moto team up on fingerprint sensor for PDAs" Electronic Engineering Times—Asia , Sep. 1-15, 2003.

Reuters News "Sony unveils first blue-laser DVD recorder" Mar. 3, 2003 Reuters LTD Retrieved from the Internet, <http://www.lexis.com/research> Lexis-Nexis database on Mar. 22, 2005.

Richter, Allan "BioChips Leveraging Semiconductor Manufacturing Roots" Semiconductor Manufacturing, vol. 4 Issue 8, pp. 29-40 Aug. 2003.

Yanchak, Mark "Optimizing Surface Mount Adhesive Jet Dispensing" APSCO International Perry Ohio Jun. 1, 2001.

Yoshida, Junko "Fingerprint sensors score in handsets" Electronic Engineering Times Jan. 16, 2004 Retrieved from the Internet <http://www.eetasia.com/ARTP_8800327536_.HTM> on Mar. 22, 2005.

* cited by examiner

METHOD OF MANUFACTURING A CAVITY PACKAGE

CROSS-REFERENCE TO RELATED APPLICATIONS

This application claims the benefit of Malaysian Application No. 20045436, filed Dec. 31, 2004, in the Intellectual Property Corporation of Malaysia, the disclosure of which is incorporated herein by reference.

BACKGROUND OF THE INVENTION

The present invention relates to generally to integrated circuit packaging technology. More particularly, embodiments of the invention pertain to methods of packaging sensor chips including optical, pressure, finger print, chemical and biological sensor chips among others.

Figure 1A:
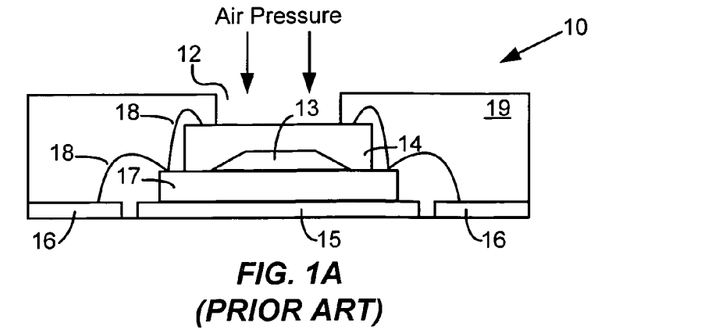
FIGS. 1A and 1B depict examples of conventional sensor chip packages having an open air cavity.
Figure 1B:
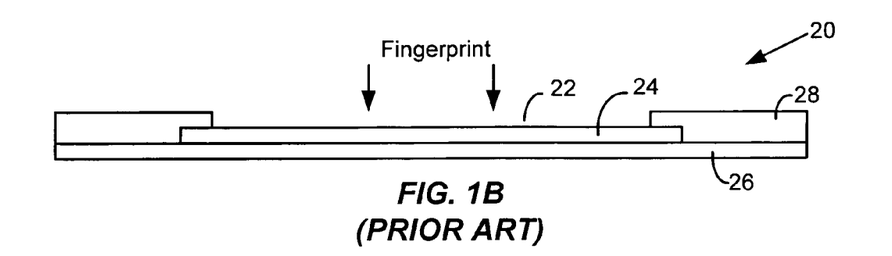

Sensor chips require exposure of some or all of the surface of the chip to stimuli being sensed. Such exposure may be in the form of an open air cavity in which the stimuli can reach the surface of the chip or by covering the surface of the chip with a material through which the stimuli can pass, for example, covering the surface of an image sensor chip with an optically transparent covering. Examples of sensor chip packages having open air cavities are shown in FIGS. 1A and 1B. FIG. 1A is a simplified cross-sectional view of an air pressure sensor 10 having an open cavity 12 through which an upper surface of a pressure sensor chip 14 is exposed to and can detect pressure differentials. Pressure sensor chip 14 is mounted to an integrated circuit 17, which in turn is mounted on a lead frame having a die pad portion 15 and a plurality of leads 16. A space 13 is formed between pressure sensor 14 and integrated circuit 17 and wirebonds 18 are used to make appropriate electrical connections within package 10. Encapsulant 19, such as encapsulant used in a transfer molding, forms a body that surrounds, binds and protects the non-sensing elements in the package. FIG. 1B is a simplified cross-sectional view of a finger print sensor 20. An open cavity 22 is sized to allow a finger to be placed on an upper surface of a sensor chip 24. Chip 24 is mounted on a base 26 and encapsulant 28 forms a body that surrounds, binds and protects the non-sensing elements in the package.

Figure 2A:
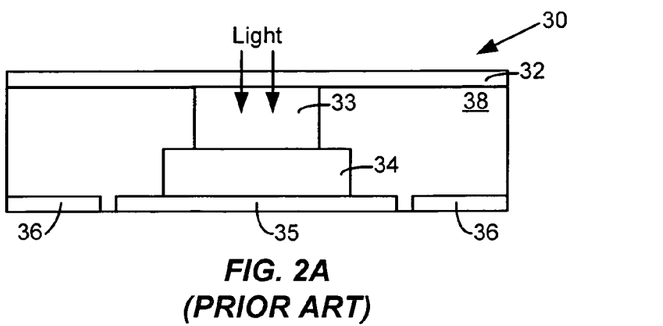
FIGS. 2A and 2B depict examples of conventional sensor chip packages having a transparent window overlying a portion of the sensor chip.
Figure 2B:
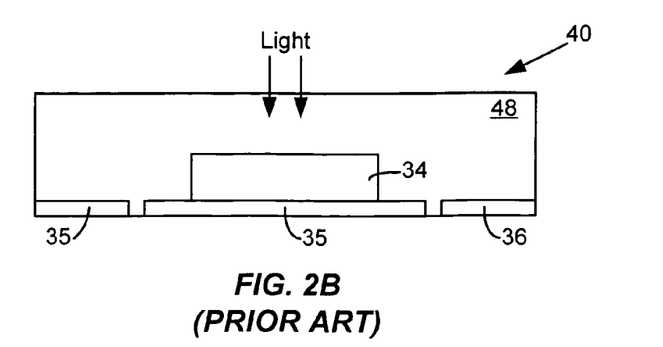

Two examples of image sensor chip packages with an optically transparent covering over the surface of the image sensor are shown in simplified cross-sectional view in FIGS. 2A and 2B. FIG. 2A shows an image sensor 30 having an optional transparent lid 32 covering a cavity 33. Light passes through lid 32 and cavity 33 to an upper surface of image sensor chip 34. Chip 34 is mounted on a lead frame having a die pad portion 35 and a plurality of leads 36. Encapsulant 38, forms a body that surrounds, binds and protects the non-sensing elements in the package. FIG. 2B shows an image sensor 40 that is similar to the sensor shown in FIG. 2A except that a transparent encapsulant 48 covers the entire package such that lid 32 and cavity 33 are not necessary.

A variety of different techniques have been developed in the industry to form sensor packages. Examples of several of the many different methods for packaging sensor chips are described in U.S. Pat. Nos. 6,300,169; 6,420,201; and 6,667,439. Despite the great variety of packaging techniques that have been developed for sensor chips, improved and/or less costly methods of packaging sensor chips are desirable.

BRIEF SUMMARY OF THE INVENTION

The present invention pertains to methods of packaging integrated circuit die. While specific embodiments of the invention are particularly useful for packaging sensor chips including optical, pressure, finger print, chemical and biological sensor chips among others, embodiments of the invention may also be useful in packaging other types of integrated circuit die.

One embodiment of a method of making a package for an integrated circuit die according to the present invention comprises providing a lead frame having a disposable metal frame, a metal die pad at a center of the frame and integrally connected to the frame and a plurality of metal leads each having an outer end integrally connected to the frame, wherein each of the metal frame, metal die pad and plurality of metal leads has a first surface and a second surface opposite the first surface; attaching an integrated circuit die having a first surface and a second surface opposite the first surface and a plurality of bonding pads formed on the first surface to the metal die pad such that the second surface of the integrated circuit die faces the first surface of the metal die pad; electrically connecting the integrated circuit die to the first surface of each of the plurality of metal leads; applying an encapsulant material over the lead frame to cover the plurality of bond pads on the integrated circuit, the electrical connections between the integrated circuit die and the plurality of metal leads and surround the curable material; and severing the die pad and the leads from the frame so as to detach the package from the frame. Prior to applying the encapsulant material over the lead frame, a curable material is selectively applied over a portion of the first surface of the integrated circuit die without covering the plurality of bonding pads and the cured material is cured.

Another embodiment of a method of making a package for an integrated circuit die according to the present invention comprises providing a semiconductor wafer having a plurality of integrated circuit die formed thereon, each integrated circuit die having a first surface and a second surface opposite the first surface and a plurality of bonding pads formed on the first surface; prior to dicing the semiconductor wafer, selectively applying a curable material over a portion of the first surface of each integrated circuit die formed on the wafer without covering the plurality of bonding pads for the respective integrated circuit die; curing the curable material; and dicing the semiconductor wafer to separate the plurality of integrated circuit die from each other.

Some embodiments comprise the additional steps of providing a lead frame strip having an outer frame and a plurality of horizontal and vertical connecting bars attached to the other frame, wherein the horizontal and vertical connecting bars define a plurality of disposable inner frames arranged in a matrix pattern within the outer frame, each inner frame comprising a die pad at a center of the inner frame and integrally connected to the inner frame and a plurality of leads associated with the die pad and having an outer end integrally connected to the inner frame; after the dicing step, attaching at least some of the separated integrated circuit die to respective die pads of the lead frame strip such that the second surface of each attached integrated circuit die faces towards the first surface of its respective die pad; electrically connecting each attached integrated circuit die to the first surface of each of the plurality of leads associated with its respective die pad; applying encapsulant material over the lead frame strip, such that for each of a plurality of integrated circuit die attached to a respective die pad within the lead frame strip, the encapsulant material covers the plurality of bond pads on the integrated circuit die, the electrical connections between the integrated circuit die and its associated plurality of leads and surrounds the cured material formed on the first surface of the integrated circuit die; and severing the die pad and the leads from the frame so as to detach the package from the frame.

These and other embodiments of the present invention, as well its advantages and features, are described in more detail in conjunction with the description below and attached figures.

DETAILED DESCRIPTION OF THE INVENTION

Embodiments of the invention pertain to methods of packaging sensor chips including optical, pressure, finger print, chemical and biological sensor chips among others. Merely by way of example, the invention is described below as it applies to a micro lead frame package (MLP) for a simplified sensor chip. It should be recognized, however, that the invention has a broader range of applicability. For example, embodiments of the invention may be used to package sensor chips using other chip scale packaging techniques and other embodiments of the invention may be used to package other types of integrated circuit die.

Figure 3A:
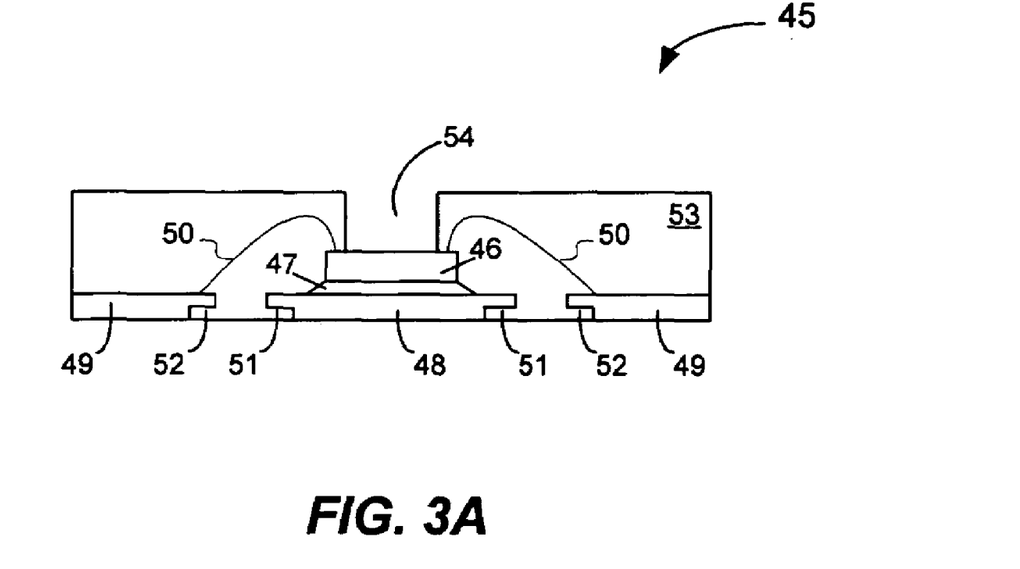
FIG. 3A is a simplified cross section of an integrated circuit sensor chip package according to embodiments of the invention.

FIG. 3A is a simplified cross-sectional view of an integrated circuit MLP 45 according to one embodiment of the present invention. MLP 45 includes a sensor chip 46 attached to a die pad 48 by a bonding layer 47, such as an adhesive tape or an epoxy material. Bonding pads (not shown) on the upper surface of chip 46 are electrically connected to leads 49 by wirebonds 50. Both die pad 48 and leads 49 have extended parts 51 and 52, respectively, that can be formed by, for example, machining or etching a shallow portion of the respective components. As would be understood by a person of ordinary skill in the art, the shape of extended parts 51 and 52 will vary depending on the method used to form the parts. The shape is shown in FIG. 3A and other figures of the present application in rectangular form to simplify the drawings.

As shown in FIG. 3A, much of the assembly, including the portions beneath extended parts 51 and 52, is covered with an encapsulant material 53 except for a cavity 54 above an upper surface of sensor chip 46 and a lower surface of die pad 48 and leads 49. Exposure of the lower surface of die pad 48 and leads 49 allows for improved heat dissipation and a thinner overall package design. The formation of cavity 54 allows the upper surface of sensor chip 46 to come in contact with stimuli from the ambient in which the sensor chip is placed.

The embodiment shown in FIG. 3A is particularly useful for any sensor chip application such as a package for pressure, finger print, chemical and biological sensor chips, among others where exposing a portion of a sensor chip to the ambient is necessary for proper operation of the sensor. While not shown in FIG. 3A, in some embodiments package 45 includes multiple chips as in the pressure sensor package shown in FIG. 1A and/or additional components.

Figure 3B:
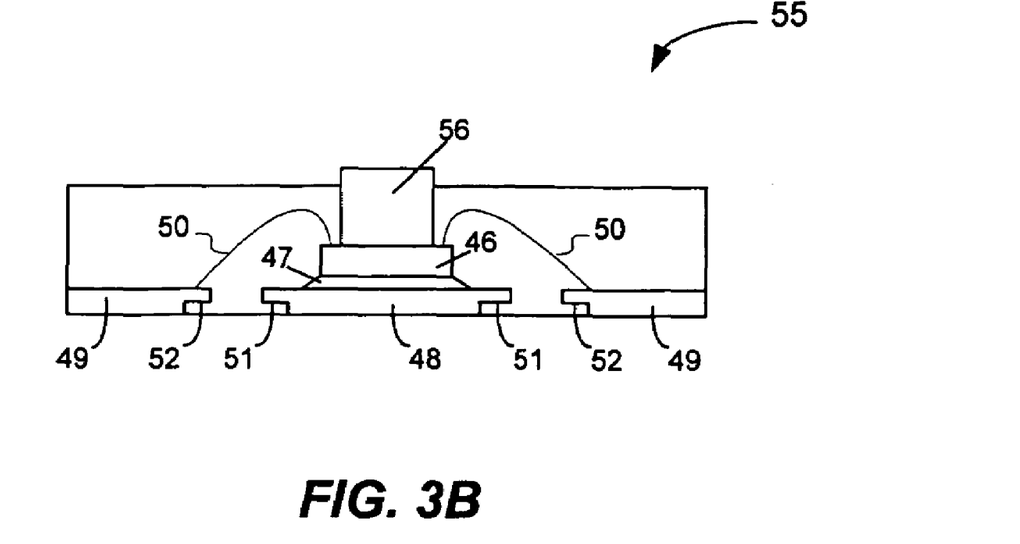
FIG. 3B is a simplified cross section of an integrated circuit sensor chip package according to embodiments of the invention.

FIG. 3B is a simplified cross-sectional view of an integrated circuit MLP 55 according to another embodiment of the present invention. MLP 55 is similar to MLP 45 except that a cavity 56 is filled with an optically transparent material. In one embodiment, the optically transparent material can be seen through by unaided human eyes. In another embodiment, the optically transparent material provides a transmission rate higher than or equal to 80% for wavelengths higher than or equal to about 350 nm. For example, the wavelengths are in the range of visible light. The embodiment shown in FIG. 3B is particularly useful as a package for image or optical sensor chips.

Figure 4:
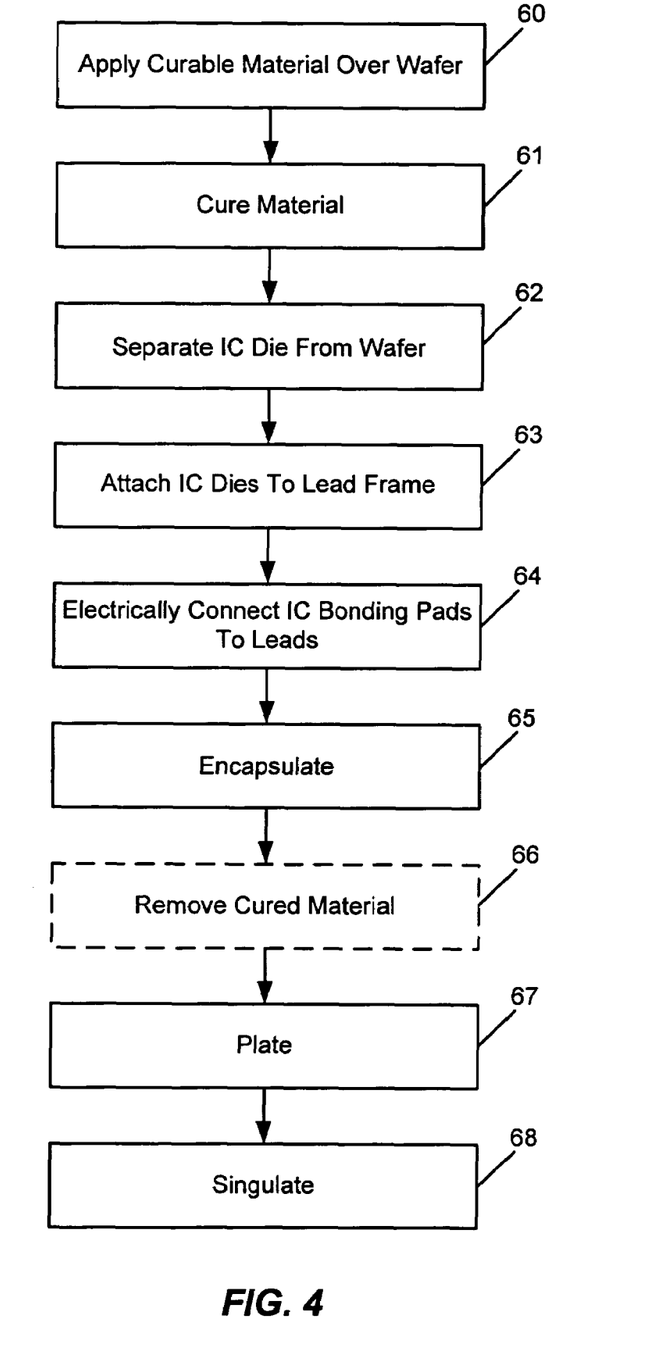
FIG. 4 is a simplified diagram for making an integrated circuit sensor chip package according to embodiments of the present invention.
Figure 5:
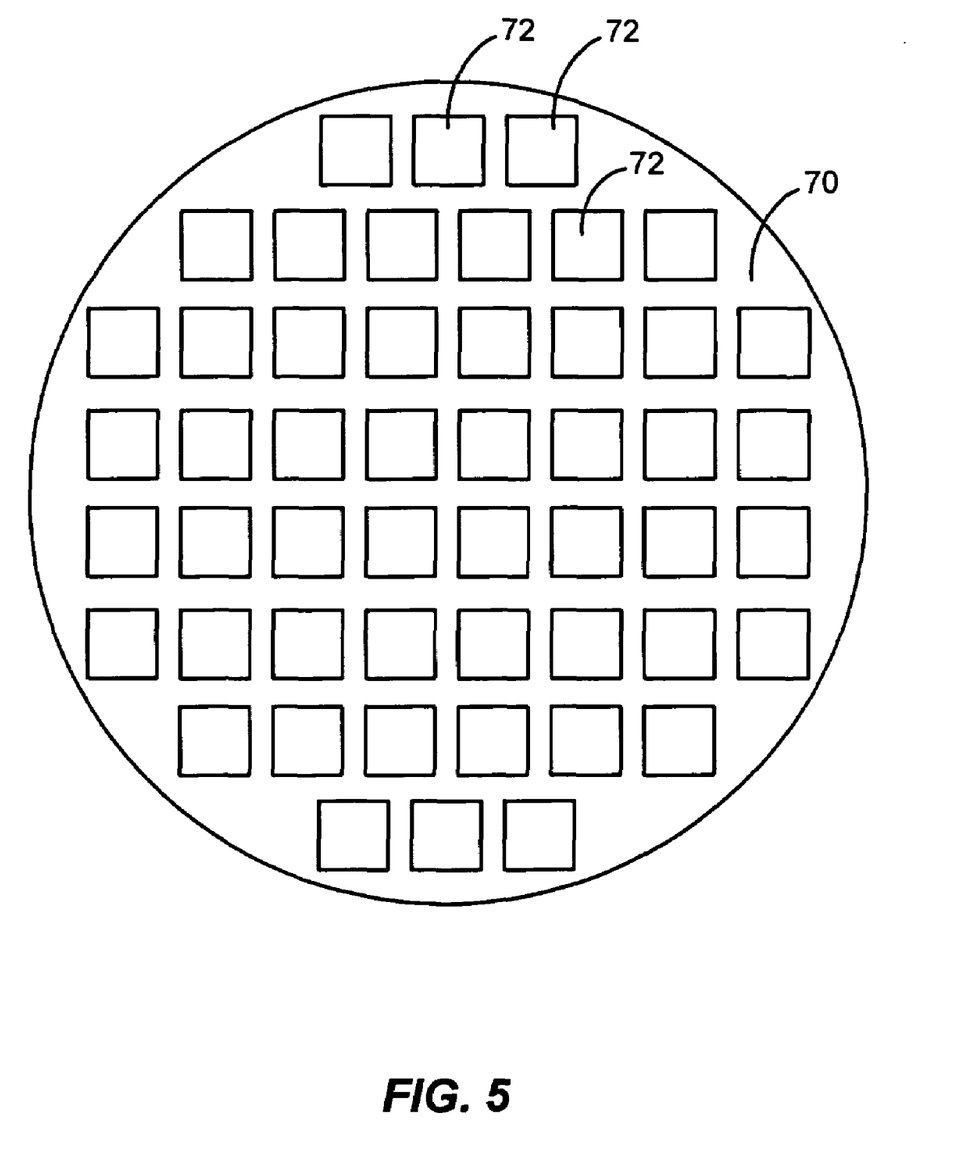
FIG. 5 is a top plan view of an uncut semiconductor wafer having a plurality of integrated circuits formed thereon.

Reference is now made to FIG. 4, which is a simplified block diagram of the steps associated with making an integrated circuit package according to the embodiments of the invention, along with FIGS. 5-10, which have been selected to help illustrate and describe the invention. As discussed below, the process set forth in FIG. 4 can be used to manufacture MLP 45 shown in FIG. 3A or MLP 55 shown in FIG. 3B. It is to be understood, however, that the process set forth in FIG. 4 is not limited to such and can instead be used to package sensor chips using chip scale packaging techniques other than MLP technology and used to package other types of integrated circuit die.

The method of making an integrated circuit package shown in FIG. 4 includes steps of: applying a curable material over a wafer (step 60), curing the material (step 61), dicing the wafer (step 62), attaching die to a lead frame (step 63), making electrical connections between the die and leads (step 64), encapsulating the package (step 65), removing the cured material (step 66), forming plating layers (step 67) and singulating packages (step 68). It is to be understood, however, that the method of the invention is not limited to the precise steps or order of steps shown in FIG. 4 and discussed in detail below. Instead, a person of skill in the art will appreciate there can be many alternatives, modifications, and variations. For example, some of the steps may be expanded to include various sub-steps and/or combined into a single step. Also, various steps other than what is shown in FIG. 4 may be included in the manufacturing process.

Embodiments of the invention apply a curable material over a wafer having at least one integrated circuit die formed thereon prior to dicing the wafer. Wafer may be, for example, a 4-inch, 8-inch or 12-inch semiconductor wafer that is typically used in the semiconductor industry, such as wafer 70 shown in FIG. 5. Wafer 70 may include a plurality of individual integrated circuits (ICs) 72 formed on a first surface 71 of the wafer. The number of ICs 72 formed on a particular wafer is dependent on the size of the wafer and the size of the individual die. Generally speaking, the process of fabricating ICs 72 on wafers 70 is very expensive so semiconductor manufacturers strive to maximize the number of ICs 72 that can be formed on a given wafer. Wafer 70 also includes a second surface 76 (shown in FIG. 6B), opposite the first surface and a side surface 78 (shown in FIG. 6B) between the first and second surfaces. While not shown in FIG. 5 or the other figures, each individual die 72 typically includes a number of bonding pads formed along one or more sides of the respective die, for example along the perimeter of each die, as is known to those of ordinary skill in the art.

Figure 6A:
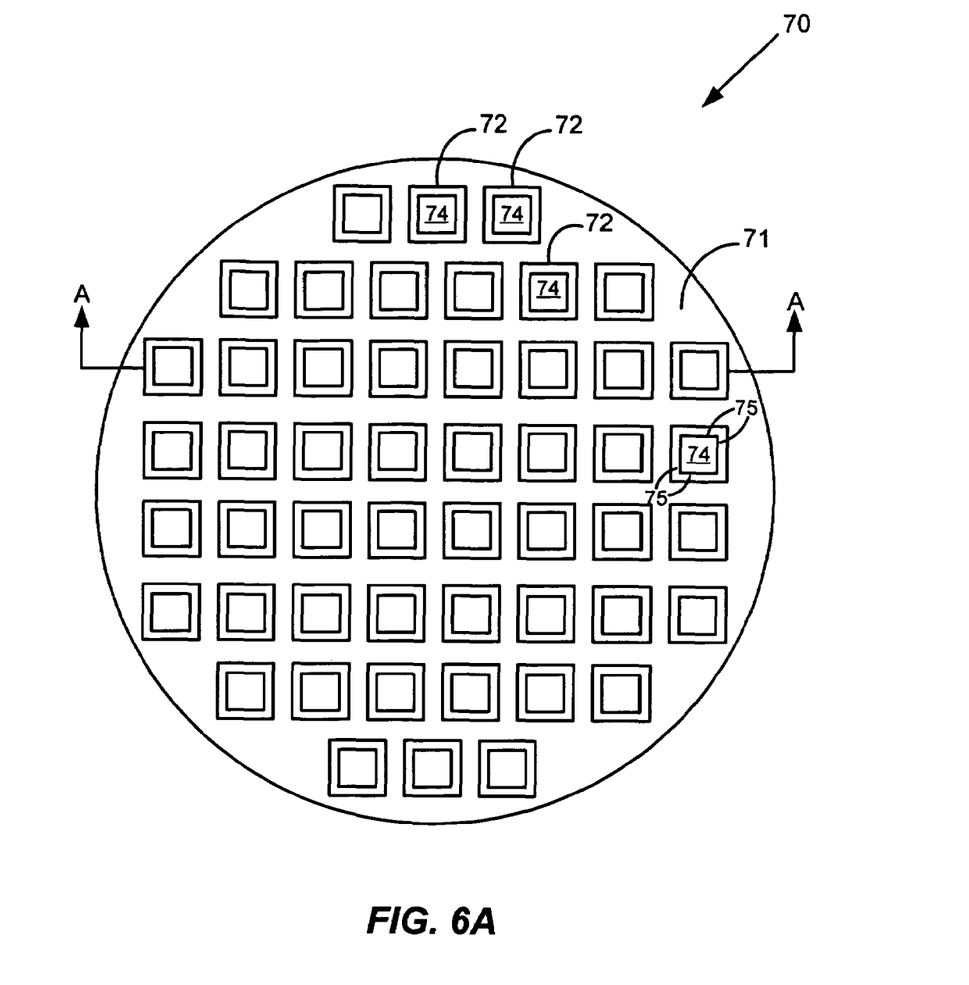
FIG. 6A is a top plan view of the uncut semiconductor wafer shown in FIG. 5 after having material screen printed over selected portions of the wafer according to embodiments of the invention.
Figure 6B:
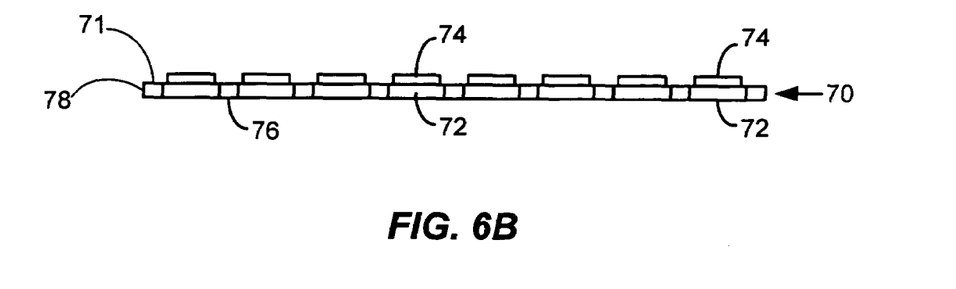
FIG. 6B is a simplified cross section of the uncut semiconductor wafer shown in FIG. 6A.

In step 60 the curable material is selectively applied to first surface 71 over a central portion of each individual die 72 on the semiconductor wafer in a manner that does not cover the bonding pads of each individual die. One example of the area over which the curable material is selectively applied is shown in FIGS. 6A and 6B. FIG. 6A is a top view of semiconductor wafer 70 shown in FIG. 5 after curable material 74 has been applied over surface 71. FIG. 6B is a simplified cross-sectional view of wafer 70 taken along line A-A in FIG. 6A.

As shown in FIGS. 6A and 6B, material 74 is applied over a central portion of each IC 72 leaving the perimeter of the IC (the area in which the bonding pads are formed) uncovered. Curable material can be applied using any appropriate technique. In some embodiments material 74 is applied using screen printing techniques that are known to those of ordinary skill in the art while in other embodiments material 74 is applied using a dispensing technology, for example using a computer controlled syringe or jet dispensing technology, that can dispense one or multiple droplets of the material as necessary as is also known to those of ordinary skill in the art. In some embodiments, curable material 74 is applied in a square or rectangular shape. In other embodiments, it may be a circular or oval shape or a combination of various shapes.

Curable material 74 can be any material appropriate for a particular packaging application. In some embodiments material 74 has is a paste like or slightly viscous material (e.g., has a viscosity greater than or equal to 60,000 centipoise) prior to being cured and then, when cured in step 61, hardens to a rubbery like material. Material 74 can be cured in step 61 using any appropriate curing technique such as thermal curing, UV curing or ebeam curing. In some embodiments, material 74 can be cured by heating the material to a temperature of between 100-150° C. or exposing the material to ultraviolet light or an ebeam without heating the wafer (or by applying minimal heat) so as to not undesirably add to the thermal budget of the ICs formed on wafer 70.

After being cured, material 74 should form a strong seal to each IC 72 so that during step 65, encapsulant does not flow under the cured material 74 to undesirably cover portions of the IC 72 below material 74. In embodiments such as FIG. 3B, material 74 should cure to an optically transparent material that allows light of appropriate wavelengths to pass through the cured material to the surface of the IC. In some such embodiments it is desirable for the material to have a refractive index of at least 1.1. In other embodiments, such as a package of the type shown in FIG. 3A, material 74 should cure to a material that is readily removable from the package in step 66 as described in more detail below.

After material 74 is selectively applied over the surface of wafer 70 and hardened during curing step 61, the integrated circuits formed on wafer 70 are separated using any appropriate technique known in the industry. For example, in some embodiments the ICs 72 are separated using a diamond impregnated blade on a circular saw (also referred to as being diced). In other embodiments separation process 62 includes partially scribing the wafer with, for example a diamond-tipped scribing tool or laser beam, followed by a mechanical breaking step. Once separated the individual ICs (sometime referred to herein as integrated circuit die or IC die) can be attached to a lead frame or other appropriate packaging base in step 63.

Figure 7A:
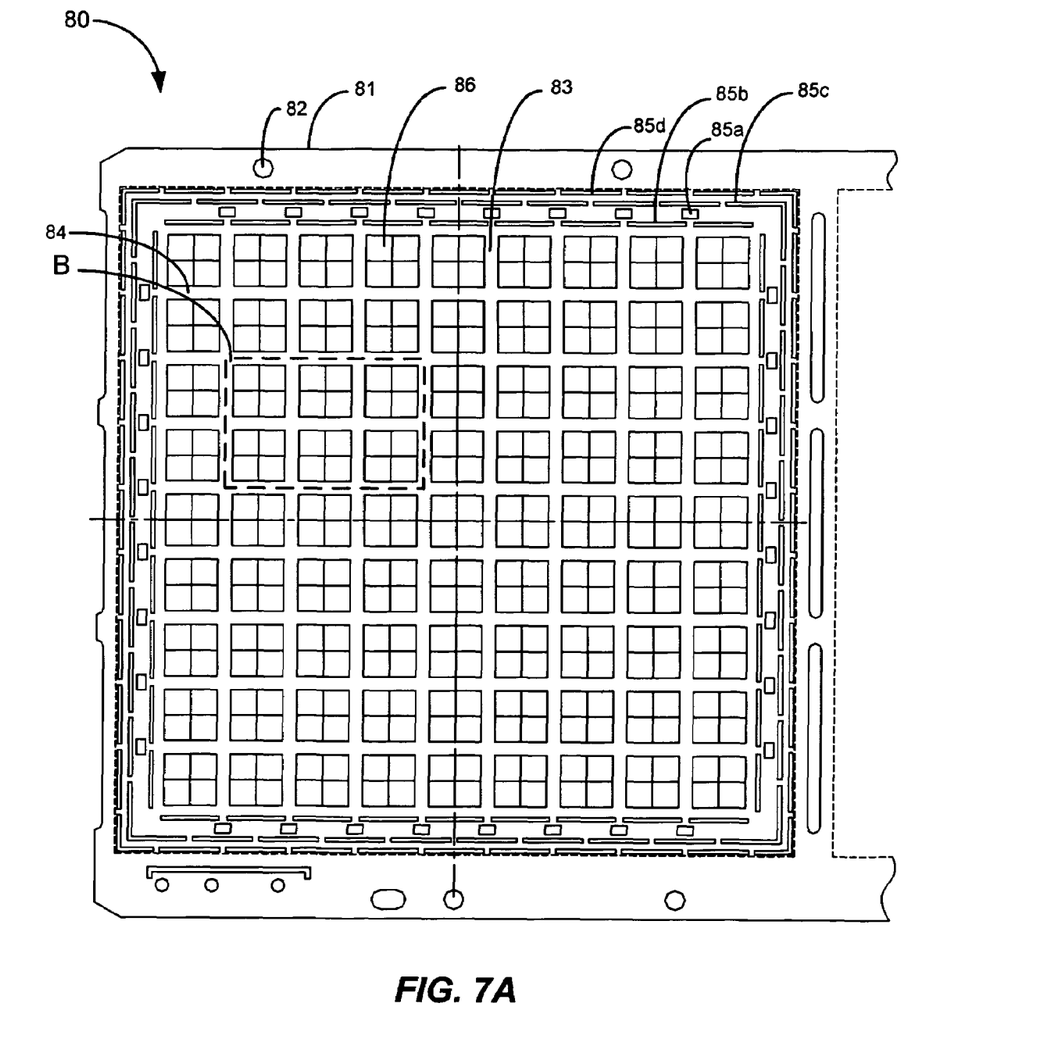
FIG. 7A is a simplified top plan view of a portion of a lead frame strip upon which a plurality of integrated circuit die can be bonded thereon according to embodiments of the invention.

FIG. 7A is a simplified view of one example of a portion of a lead frame strip 80 that a plurality of IC die 72 can be attached to in step 63. Lead frame strip 80 includes an outer frame 82 to which a number of vertical and horizontal connecting bars 83 and 84 are attached. Horizontal and vertical connecting bars 83, 84 define a plurality of inner frames arranged in a matrix that each include an integrated circuit receiving area 86. Lead frame strip 80 shown in FIG. 7A includes a matrix of 9×9 integrated circuit receiving areas 86 but other embodiments of the invention may include matrices of other sizes. Also, in some embodiments, lead frame strip 80 includes a plurality of matrices of integrated circuit receiving areas, each within a respective outer frame 81, arranged adjacent to each other as indicated by the dashed lines on the right edge of FIG. 7A. Such a plurality of matrices and outer frames may include outer frames side-by-side with each other as well as outer frames on top of and/or below each other.

Figure 7B:
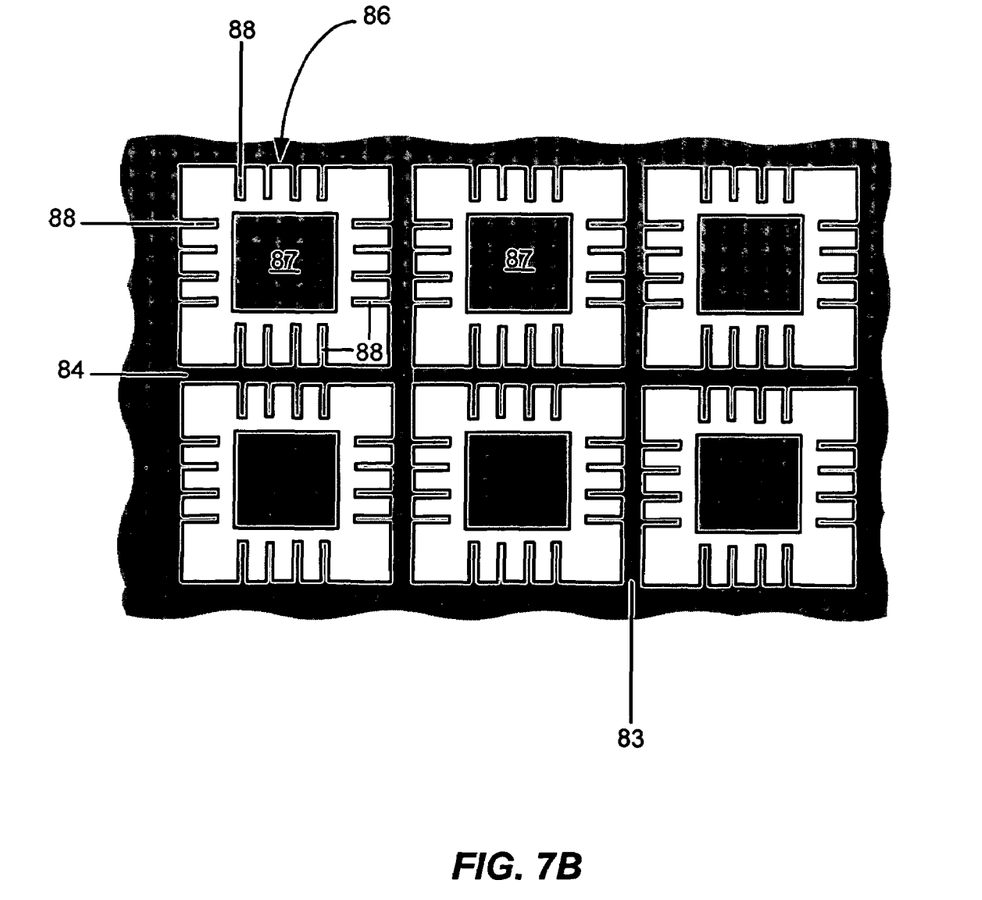
FIG. 7B is a detailed top view of a portion of the lead frame strip shown in FIG. 7A.

Outer frame 81 includes a plurality of holes 85a and elongated slots 85b, 85c, 85d around a periphery of the outer frame that reduce the stress and possible bending of the frame during subsequent processes, such as the encapsulating process. Outer frame 81 also includes a plurality of positioning holes 82 outside of the holes/slots 85a-85d that are used to position the lead frame strip on appropriate tools during subsequent steps such as die attach step 63, wirebonding step 64, encapsulation step 65 and singulation step 68. Further details of lead frame strip 80 can be found in U.S. Published Application 2002/0105063, which is incorporated by reference herein Reference is now made to FIG. 7B, which is an enlarged view of a portion of lead frame strip 80 designated by dashed lines B in FIG. 7A. In FIG. 7B the solid metal lead frame is shown in gray shading with the white space between the shaded regions representing empty space (portions of the lead frame that were cut away). Each integrated circuit receiving area 86 is defined by portions of the vertical and horizontal connecting bars 83, 84 surrounding the particular IC receiving area and includes a die pad 87 and a plurality of leads 88. Each die pad 87 is integrally connected to a frame by tie bars (not shown) that extend from the corner of the die pad to the connecting bars 83, 84, while leads 88 are positioned around each die pad 87 and extend towards the die pad from a vertical or horizontal connecting bar 83, 84 to which the lead is attached at its outer end.

Figure 8:
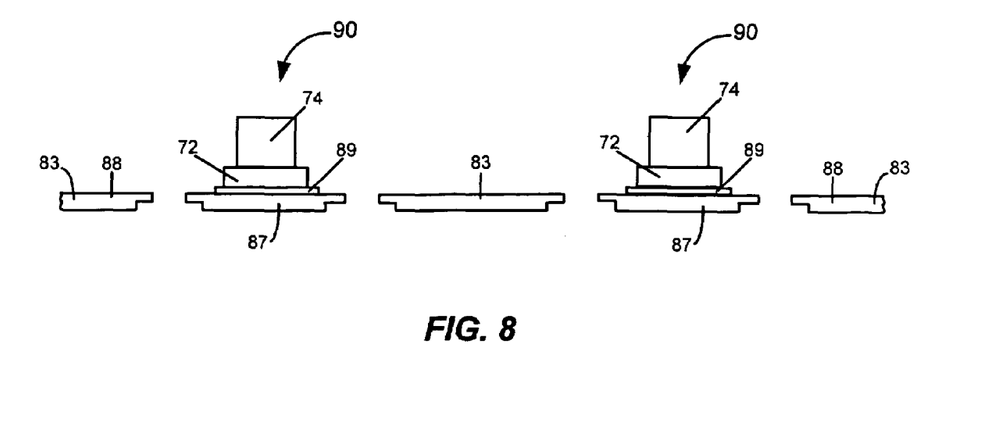
FIG. 8 is a simplified cross section of a portion of the lead frame strip having a plurality of integrated circuit die attached thereto.

During step 63, IC dies 72 are attached a die pad 87 in each integrated circuit receiving area using an appropriate bonding layer 89. For example, bonding layer 89 is an adhesive tape. In other embodiments, bonding layer 89 is an epoxy adhesive. Also, in some embodiments a strip of tape is attached to the bottom of lead frame strip 80 to protect bottom surfaces of the lead frame from being covered by the encapsulant material during step 65. When used, such tape can be applied to the lead frame strip any time prior to step 65. FIG. 8 is a simplified cross-sectional view of a portion of lead frame strip 80 that includes two partially formed IC packages 90 as of after die attach step 63.

Figure 9:
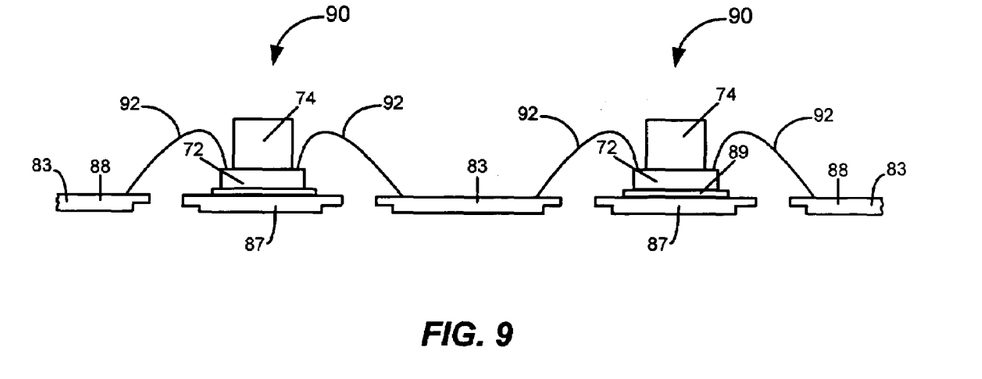
FIG. 9 is a simplified cross section of the portion of the lead frame strip shown in FIG. 8 after bonding pads of integrated circuit die are electrically connected to the leads of the package prior to the encapsulation process according to embodiments of the invention.
Figure 10:
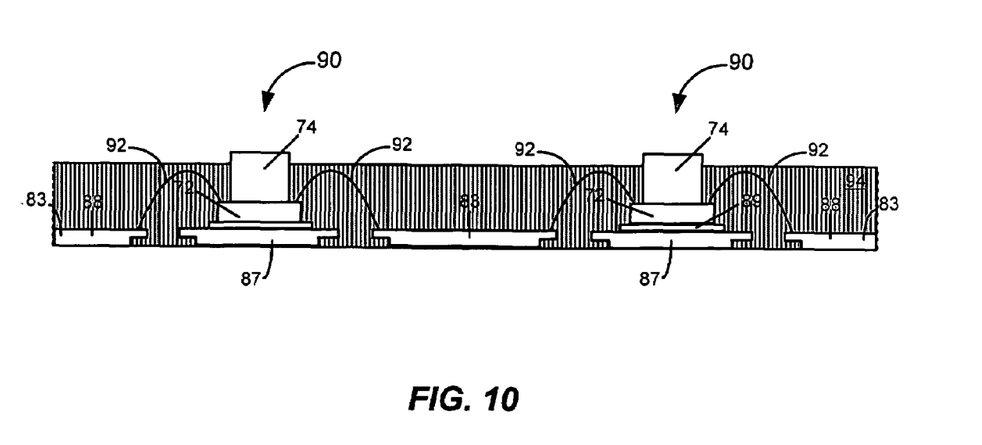
FIG. 10 is a simplified cross section of the portion of the lead frame strip shown in FIG. 9 after the encapsulation process.

After an IC die 72 is attached to each integrated chip receiving area 86 on lead frame 80, conductive wires 92 are connected between the bonding pads of each IC die 72 and the leads 88 surrounding the die (step 64) as shown in FIG. 9. The conductive wires may be attached using, for example, well known wire bonding techniques. Next, an encapsulant material 94 is applied over selected portions of the structure using, for example, well known transfer molding techniques. In one embodiment the encapsulant material is applied as a single block that covers the entire matrix of IC receiving areas 86 within outer frame 82. As shown in FIG. 10, the encapsulant material 94 is applied to surround but not cover cured material 74. Typically the thickness of encapsulant material 94 is determined by the desired thickness of the package which may be defined by a standard such as a JEDEC standard or a particular manufacturers specification.

In order to ensure that the encapsulant material does not flow over and cover cured material 74, cured material 74 is typically formed to a thickness that is slightly higher than the expected top of encapsulant 94 shown by height X in FIG. 10. In some embodiments the height of the cured material is chosen so that, during the encapsulating process, the upper surface of the cured material comes in contact with the top interior surface of the mold in order to prevent the encapsulant material from flowing over and covering the cured material. In some embodiments, the top interior surface of the mold that defines the upper surface of the encapsulated package is padded with a soft coating layer, for example a silicon-based layer, that improves the sealing between the cured material 74 and the top interior surface of the mold.

In some embodiments the portion of material 74 that extends above encapsulant 92 (height X) is selected to be between 10-50 percent of the overall thickness of material 74. For example, on one specific embodiment, X is approximately 20 percent of the overall height of material 74. The actual height of X will depend, among other factors, on the physical properties of material 74 (for example, the softness of the material), the manufacturer's desired specifications for a particular packaging application and the controllability of the encapsulating process. In some such embodiments (especially where the cured material remains part of the final package such as in sensors of FIG. 3B), the upper surface of the cured material can be made flush with the upper surface of encapsulant 94 after the molding process using an appropriate mechanical grinding or chemical etching technique.

If packages 90 being formed are of the type that include a cavity open to the ambient as shown in FIG. 3A, material 74 is removed after the encapsulant material 94 has been applied over selected portions of lead frame strip 80. Cured material 74 may be removed using either mechanical or chemical means. For example, in some embodiments, material 74 is removed with an adhesive tape that is temporarily secured to the top of partially formed packages and on top of material 74. The tape is selected so that its adhesive bond to material 74 is stronger than the bond of material 74 to die 72 but weaker than the bond of encapsulant 94 to the various elements of the package. In other embodiments, material 74 can be removed using a chemical etchant that exhibits a high etch selectivity for material 74 relative to encapsulant 94 (i.e., the etchant should etch material 74 at a significantly faster rate than it etches encapsulant 94). For packages of the type shown in FIG. 3B, material 74 does not need to be removed and becomes part of the final package.

Next, one or more plating layers may be formed on the bottom of the lead frame during step 67 and then the IC packages 90 are singulated in step 68 by separating all the respective leads and tie bars from the various vertical and horizontal connecting bars of the lead frame. For pre-plated lead frame, step 67 is generally not required. The singulation process may employ, for example, well known sawing and/or punching techniques. In one embodiment, each singulated IC package corresponds to a package 45 or 55 in one of FIG. 3A or 3B.

The description above has been given to help illustrate the principles of this invention. It is not intended to limit the scope of this invention in any way. A large variety of variants are apparent, which are encompassed within the scope of this invention. For example, based on the above description, a person of skill in the art will appreciate that embodiments of the invention are not limited to MLP packages and instead can be used with other types of chip scale packages including packages in which the bottom surface of the leadframe is covered with encapsulant, chip-on-lead and other packages that do not include a die pad and packages that use substrate bases instead of lead frame bases among others. Also, while the invention has been described in detail and with reference to specific examples thereof, it will be apparent to one skilled in the art that various changes and modifications can be made therein without departing from the spirit and scope thereof. One such example is that in some embodiments of the invention, the curable material can be applied over the integrated circuits and cured after the semiconductor wafer upon which the integrated circuits are formed is diced. For example, the curable material could be applied over the integrated circuits and cured after the integrated circuits are attached to the lead frame (step 63) but prior to the encapsulating process (step 65), and preferably prior to the wirebonding process (step 64). Alternatively, the diced integrated circuits could be transferred to a dedicated station where the curable material is applied over the circuits and cured prior to attaching the circuits to the lead frame. Also, in another embodiment, more than one integrated circuit die can be attached to a single die pad area where the additional integrated circuit dice may or may not include cured material over a portion of their surface. These equivalents and alternatives are intended to be included within the scope of the present invention.

What is claimed is:

1. A method of making packages for integrated circuit die, the method comprising:
   providing a semiconductor wafer having a plurality of integrated circuit die formed thereon, each integrated circuit die having a first surface and a second surface opposite the first surface and a plurality of bonding pads formed on the first surface;

prior to dicing the semiconductor wafer, selectively applying a curable material over a portion of the first surface of each integrated circuit die formed on the wafer without covering the plurality of bonding pads for the respective integrated circuit die;

curing the curable material;

dicing the semiconductor wafer to separate the plurality of integrated circuit die from each other;

attaching at least some of the separated integrated circuit die to die pads of a lead frame strip; and applying an encapsulant material over the lead frame strip having the integrated circuit die attached;

wherein the cured material extends above the encapsulant material.

2. The method of claim 1 wherein the lead frame strip is comprised of an outer frame and a plurality of horizontal and vertical connecting bars attached to the outer frame, wherein the horizontal and vertical connecting bars define a plurality of disposable inner frames arranged in a matrix pattern within the outer frame, each inner frame comprising a die pad at a center of the inner frame and integrally connected to the inner frame and a plurality of leads associated with the die pad and having an outer end integrally connected to the inner frame and wherein the method further comprises:

electrically connecting each attached integrated circuit die to the first surface of each of the plurality of leads associated with its respective bonding pads.

3. The method of claim 2 wherein the encapsulant material is applied over the lead frame strip, such that for each of a plurality of integrated circuit die attached to a respective die pad within the lead frame strip, the encapsulant material covers the plurality of bond pads on the integrated circuit die, the electrical connections between the integrated circuit die and its associated plurality of leads and surrounds the cured material formed on the first surface of the integrated circuit die.

4. The method of claim 3 further comprising severing the die pad and the leads from the frame so as to detach the package from the frame.

5. The method of claim 3 wherein the curable material provides a transmission rate higher than or equal to 80% for wavelengths in the range of visible light.

6. The method of claim 1 wherein the curable material is applied to the wafer using a screen printing process.

7. The method of claim 1 wherein the curable material is applied to the wafer using jet dispensing techniques.

8. The method of claim 1 wherein the cured material extends above the encapsulant material by a height that is at least 10 percent of the height of the cured material.

9. The method of claim 1 wherein the cured material extends above the encapsulant material by a height that is between 10 to 50 percent of the height of the cured material.

10. The method of claim 2 wherein at least one of the bonding pads of each integrated circuit die is wire bonded to the first surface of at least one of the plurality of leads surrounding the integrated circuit die.

11. The method of claim 1 wherein the integrated circuit comprises an integrated circuit sensor chip.

12. The method of claim 1 wherein the curable material has a viscosity greater than about 60,000 centipoise.

13. The method of claim 1 further comprising planarizing an upper surface of the cured material and an upper surface of the encapsulant material.

14. A method of making packages for integrated circuit die, the method comprising:

providing a semiconductor wafer having a plurality of integrated circuit die formed thereon, each integrated circuit die having a first surface and a second surface opposite the first surface and a plurality of bonding pads formed on the first surface;

prior to dicing the semiconductor wafer, selectively applying a curable material over a portion of the first surface of each integrated circuit die formed on the wafer without covering the plurality of bonding pads for the respective integrated circuit die;

curing the curable material;

dicing the semiconductor wafer to separate the plurality of integrated circuit die from each other;

after the dicing step, attaching at least some of the separated integrated circuit die to die pads of a lead frame strip; electrically connecting the integrated circuit die to at least one of a plurality of leads; applying an encapsulant material over the lead frame strip having the integrated circuit die attached; and after applying the encapsulant material, removing the cured material from the first surface of the integrated circuit die prior to severing the die pad and the leads from the frame.

15. A method of making a package for an integrated circuit die, the method comprising:

providing a lead frame having a disposable metal frame, a metal die pad at a center of the frame and integrally connected to the frame and a plurality of metal leads each having an outer end integrally connected to the frame, wherein each of the metal frame, metal die pad and plurality of metal leads has a first surface and a second surface opposite the first surface;

attaching an integrated circuit die having a first surface and a second surface opposite the first surface and a plurality of bonding pads formed on the first surface to the metal die pad such that the second surface of the integrated circuit die faces the first surface of the metal die pad;

electrically connecting the integrated circuit die to the first surface of each of the plurality of metal leads;

applying an encapsulant material over the lead frame to cover the plurality of bond pads on the integrated circuit, the electrical connections between the integrated circuit die and the plurality of metal leads and surround the curable material; and severing the die pad and the leads from the frame so as to detach the package from the frame;

wherein prior to applying the encapsulant material over the lead frame, a curable material is selectively applied over a portion of the first surface of the integrated circuit die without covering the plurality of bonding pads and the curable material is cured, and wherein after applying the encapsulant material the cured material extends above the encapsulant material.

16. The method of claim 15 farther comprising removing the cured material from the integrated circuit after the encapsulant material is applied over the lead frame.

17. The method of claim 16 wherein the cured material is mechanically removed from the integrated circuit.

18. The method of claim 16 wherein the cured material is chemically removed from the integrated circuit.

19. The method of claim 15 wherein the cured material is an optically transparent material that enables an unaided human eye to see the first surface of the integrated circuit.

20. The method of claim 19 wherein the curable material provides a transmission rate higher than or equal to 80% for wavelengths in the range of visible light.

21. A method of making a package for an integrated circuit die, the method comprising:

providing a semiconductor wafer having a plurality of integrated circuit die formed thereon, each integrated circuit die having a first surface and a second surface opposite the first surface and a plurality of bonding pads formed on the first surface;

prior to dicing the semiconductor wafer, selectively applying a curable material over a portion of the first surface of an integrated circuit die formed on the wafer without covering the plurality of bonding pads;

curing the curable material;

dicing the semiconductor wafer to separate the integrated circuit die from other integrated circuit die formed upon the wafer;

providing a lead frame having a disposable metal frame, a metal die pad at a center of the frame and integrally connected to the frame and a plurality of metal leads each having an outer end integrally connected to the frame, wherein each of the metal frame, metal die pad and plurality of metal leads has a first surface and a second surface opposite the first surface;

after the dicing step, attaching the integrated circuit die to the metal die pad such that the second surface of the integrated circuit die faces the first surface of the metal die pad;

electrically connecting the integrated circuit die to the first surface of at least one of the plurality of metal leads;

applying an encapsulant material over the lead frame to cover the plurality of bond pads on the integrated circuit, the electrical connections between the integrated circuit die and the plurality of metal leads and surround the cured material, wherein the cured material extends above the encapsulant material; and severing the die pad and the leads from the frame so as to detach the package from the frame.

22. The method of claim 21 wherein the step of attaching the integrated circuit die to the die pad comprises, for at least some die pads, attaching at least a second integrated circuit die to the die pad, and wherein the second integrated circuit die is subsequently covered with encapsulating material during the applying step.

23. The method of claim 22 wherein the second integrated circuit die does not include cured material over any portion of its surface.

24. A method of making packages for integrated circuit die, the method comprising:

providing a semiconductor wafer having a plurality of integrated circuit die formed thereon, each integrated circuit die having a first surface and a second surface opposite the first surface and a plurality of bonding pads formed on the first surface;

prior to dicing the semiconductor wafer, selectively applying a curable material over a portion of the first surface of each integrated circuit die formed on the wafer without covering the plurality of bonding pads for the respective integrated circuit die;

curing the curable material;

dicing the semiconductor wafer to separate the plurality of integrated circuit die from each other;

after the dicing step, attaching at least some of the separated integrated circuit die to die pads of a lead frame strip;

electrically connecting the integrated circuit die to at least one of a plurality of leads;

applying an encapsulant material over the lead frame strip having the integrated circuit die attached; and after applying the encapsulant material, removing the cured material from the first surface of the integrated circuit die.

* * * * *